US006852965B2

United States Patent
Ozawa

(10) Patent No.: US 6,852,965 B2
(45) Date of Patent: *Feb. 8, 2005

(54) IMAGE SENSOR APPARATUS HAVING ADDITIONAL DISPLAY DEVICE FUNCTION

(75) Inventor: Tokuroh Ozawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/392,824

(22) Filed: Mar. 21, 2003

(65) Prior Publication Data

US 2003/0178551 A1 Sep. 25, 2003

Related U.S. Application Data

(63) Continuation of application No. 09/297,287, filed as application No. PCT/JP98/03916 on Sep. 1, 1998, now Pat. No. 6,559,433.

(30) Foreign Application Priority Data

Sep. 1, 1997 (JP) .............................................. 9-236352

(51) Int. Cl.⁷ .............................................. H01L 27/00
(52) U.S. Cl. ................................. 250/208.1; 250/214 R
(58) Field of Search .......................... 250/208.1, 214 R, 250/214.1; 345/100, 87, 97, 92; 348/294, 302, 307, 308; 257/440, 291, 292

(56) References Cited

U.S. PATENT DOCUMENTS 4,534,622 A    8/1985  Harada et al.
6,373,460 B1   4/2002  Kubota et al. .............. 345/100
6,583,779 B1 * 6/2003  Ushirono .................... 345/100

FOREIGN PATENT DOCUMENTS

| EP | 0 490 683 A2 | 6/1992 |
| EP | 0 587 236 A2 | 3/1994 |
| JP | A-60-76861   | 5/1985 |
| JP | A-5-121715   | 5/1993 |
| JP | A-6-276352   | 9/1994 |
| JP | A-7-322005   | 12/1995 |
| JP | A-8-54836    | 2/1996 |
| JP | A-8-129358   | 5/1996 |
| JP | A-8-321912   | 12/1996 |

* cited by examiner

Primary Examiner—Que T. Le
(74) Attorney, Agent, or Firm—Oliff & Berridge, PLC

(57) ABSTRACT

An image sensor apparatus is provided having an additional display device function which can be used both as an active-matrix-type display device and as an image sensor by using thin-film optoelectronic transducers which function as a light-emitting element and a light-receiving element. Each of the pixels arranged in a matrix is formed with a first pixel section including a first conduction control circuit to which a scanning signal is supplied through a scanning line, and a first thin-film optoelectronic transducer capable of performing light emission or light reception, connected to a first wiring and a second wiring via this circuit; and a second pixel section including a second conduction control circuit to which the scanning signal is supplied through the scanning line, and a second thin-film optoelectronic transducer capable of performing light emission or light reception, connected to the first wiring and a third wiring via this circuit.

13 Claims, 11 Drawing Sheets

POTENTIAL FLUCTUATION OF PX11

POTENTIAL FLUCTUATION OF PX11

POTENTIAL FLUCTUATION OF PX11

POTENTIAL FLUCTUATION OF PX21

IMAGE SENSOR APPARATUS HAVING ADDITIONAL DISPLAY DEVICE FUNCTION

BACKGROUND OF THE INVENTION

1. Field of Invention

The present invention relates to a new apparatus (image sensor apparatus having an additional display device function) that can be used both as an active-matrix-type display device and as an image sensor.

2. Description of Related Art

An active-matrix-type display device in which current-control-type light-emitting elements, such as EL (electroluminescence) elements or LEDs (light-emitting diodes), are used is disclosed in, for example, Japanese Unexamined Patent Publication Nos. 8-54836 and 8-129358. Since any of the light-emitting elements used for this type of display device emits light by itself, there are advantages that, unlike liquid-crystal display devices, it does not require a backlight, and dependence upon viewing angle is small. Meanwhile, as facsimile machines are in the midst of becoming more widespread in ordinary households, there has been a demand for more inexpensive ones as household electrical appliances.

However, since image sensors used in conventional facsimile machines require an optical system, a mechanical system, sensors, an illumination system, and the like, which are expensive, it is difficult to achieve lowering of the price of a facsimile machine.

SUMMARY OF THE INVENTION

Here, the inventors of the present invention have taken note of the fact that the current-control-type light-emitting element functions also as a PD (photodiode) element depending on the driving conditions and have proposed a new apparatus which can be used both as an active-matrix-type display device and as an image sensor.

In other words, an object of the present invention is to provide an image sensor apparatus having an additional display device function which can be used both as an active-matrix-type display device and as an image sensor by using thin-film optoelectronic transducers which function as light-emitting elements and light-receiving elements.

In order to solve the above-described problems, an image sensor apparatus having an additional display device function of the present invention includes: a plurality of pixels arranged in matrix, scanning lines to which a scanning signal for selecting the pixels in sequence is supplied, and first to third wirings used as signal lines when light emission or light reception is performed by the pixels selected by the scanning line, wherein the pixels include a first pixel section having a first conduction control circuit to which the scanning signal is supplied through the scanning line, and a first thin-film optoelectronic transducer capable of performing light emission and light reception, connected to the first wiring and the second wiring via the first conduction control circuit; and a second pixel section having a second conduction control circuit to which the scanning signal is supplied through the scanning line, and a second thin-film optoelectronic transducer capable of performing light emission and light reception, connected to the first wiring and the third wiring via the second conduction control circuit.

In the image sensor apparatus having an additional display device function of the present invention, since each pixel is formed with first and second thin-film optoelectronic transducers which function as a light-emitting element and a light-receiving element, by only changing the method of driving these thin-film optoelectronic transducers, it is possible to use the image sensor apparatus having an additional display device function as an image sensor apparatus and as a display device. Also, in the image sensor apparatus having an additional display device function of the present invention, since each optoelectronic transducer is formed of a thin-film optoelectronic transducer, it can be manufactured by a semiconductor process in a manner similar to that for an active-matrix substrate of a liquid-crystal display device. Furthermore, since an optical system, a mechanical system, sensors, illumination, and the like, which are expensive, are not required, the readout section and the like of a facsimile machine can be lowered in price.

In the present invention, there is a case in which the conduction control circuit is composed of one thin-film transistor (hereinafter referred to as a TFT) and there is a case in which the conduction control circuit is composed of thin-film transistors of two stages, in each of the first and second pixel sections.

In the case where the conduction control circuit is composed of one TFT, first, the first conduction control circuit and the second conduction control circuit are each formed with one TFT in which the scanning signal is supplied to the gate electrode. Of these TFTs, the TFT of the first conduction control circuit is connected at one of its source and drain regions to the second wiring and connected at the other to the pixel electrode of the first thin-film optoelectronic transducer. Also, the TFT of the second conduction control circuit is connected at one of its source and drain regions to the third wiring and connected at the other to the pixel electrode of the second thin-film optoelectronic transducer.

With such a construction as described above, preferably, a switching circuit is provided such that, when the thin-film optoelectronic transducer is used as a light-emitting element, the wiring of the second and third wirings to which the thin-film optoelectronic transducer is connected is connected to an output circuit for a switch on/off control signal, and when the thin-film optoelectronic transducer is used as a light-receiving element, the wiring of the second and third wirings to which the thin-film optoelectronic transducer is connected is connected to a photocurrent detection circuit, and the first wiring is connected to a constant-voltage power source. With this construction, by only switching the connected state of the second and third wirings by the switching circuit, it is possible to cause both the first and second pixel sections to function as a light-emitting section or a light-receiving section and also possible to cause one of them to function as a light-emitting section and the other to function as a light-receiving section.

In the present invention, when the conduction control circuit is formed of TFTs of two stages, first, the first conduction control circuit and the second conduction control circuit are each formed with a first TFT in which the scanning signal is supplied to the gate electrode and a second TFT in which the gate electrode is connected to the first wiring through the first TFT. Of these TFTs, the second TFT of the first conduction control circuit is connected at one of its source and drain regions to the second wiring and connected at the other to the pixel electrode of the first thin-film optoelectronic transducer. Also, the second TFT of the second conduction control circuit is connected at one of its source and drain regions to the third wiring and connected at the other to the pixel electrode of the second thin-film optoelectronic transducer.

With such a construction as described above, a switching circuit is provided such that, when the thin-film optoelectronic transducer is used as a light-emitting element, the wiring of the second and third wirings to which the thin-film optoelectronic transducer is connected is connected to a constant-voltage power source, and when the thin-film optoelectronic transducer is used as a light-receiving element, the wiring of the second and third wirings to which the thin-film optoelectronic transducer is connected is connected to a photocurrent detection circuit, and the first wiring is connected to an output circuit for receiving a signal for controlling the conduction state of the second TFT. With such a construction, by only switching the connected state of the second and third wirings by the switching circuit, it is possible to cause both the first and second pixel sections to function as a light-emitting section or a light-receiving section, and also possible to cause one of them to function as a light-emitting section and the other to function as a light-receiving section.

In the present invention, the formation area of the pixel electrode of the first thin-film optoelectronic transducer and the formation area of the pixel electrode of the second thin-film optoelectronic transducer are preferably intermingled with each other. With such a construction, when the image sensor apparatus having an additional display device function is used as an image sensor apparatus, the light which is output from the side of the pixel section that functions as a light-emitting section is reflected by a readout object, such as a document, a drawing, or a photograph, and efficiently reaches the side of the pixel section that functions as a light-receiving section.

In the present invention, the formation area of the pixel electrode of the first thin-film optoelectronic transducer and the formation area of the pixel electrode of the second thin-film optoelectronic transducer are preferably such that the center-of-gravity positions of both are close to each other in comparison with a construction in which the outer frame of the pixel electrode is partitioned by a straight line. For example, the formation area of the pixel electrode of the first thin-film optoelectronic transducer is preferably surrounded by the formation area of the pixel electrode of the second thin-film optoelectronic transducer. In this case, the formation area of the pixel electrode of the first thin-film optoelectronic transducer is preferably in the central portion of the formation area of the pixel electrode of the second thin-film optoelectronic transducer. With such a construction as described above, when the image sensor apparatus having an additional display device function is used as an image sensor apparatus, the light which is output from the side of the pixel section that functions as a light-emitting section is reflected by a readout object, such as a document, a drawing, or a photograph, and efficiently reaches the side of the pixel section that functions as a light-receiving section.

In the present invention, a light-shielding layer is preferably formed between the pixel electrode of the first thin-film optoelectronic transducer and the pixel electrode of the second thin-film optoelectronic transducer. With such a construction, even if light is emitted in all directions from the side of the pixel section which functions as a light-emitting section, it is possible for the light-shielding layer to prevent the light from leaking to the portion of the pixel section which functions as a light-receiving section. Therefore, it is possible to read an image from a readout object at a high S/N ratio.

DETAILED DESCRIPTION OF PREFERRED EMBODIMENTS

The embodiments of the present invention will be described with reference to the drawings.
[First Embodiment]
(Overall Construction of Active-Matrix Substrate)

FIGS. 1 to 4(B) are respectively an equivalent circuit diagram of an active matrix used for an image sensor apparatus having an additional display device function, an enlarged plan view showing one of a plurality of pixels formed in this active matrix, sectional views showing the construction of each element formed in this pixel, and waveform charts showing potential fluctuation in two pixels.

Figure 1:
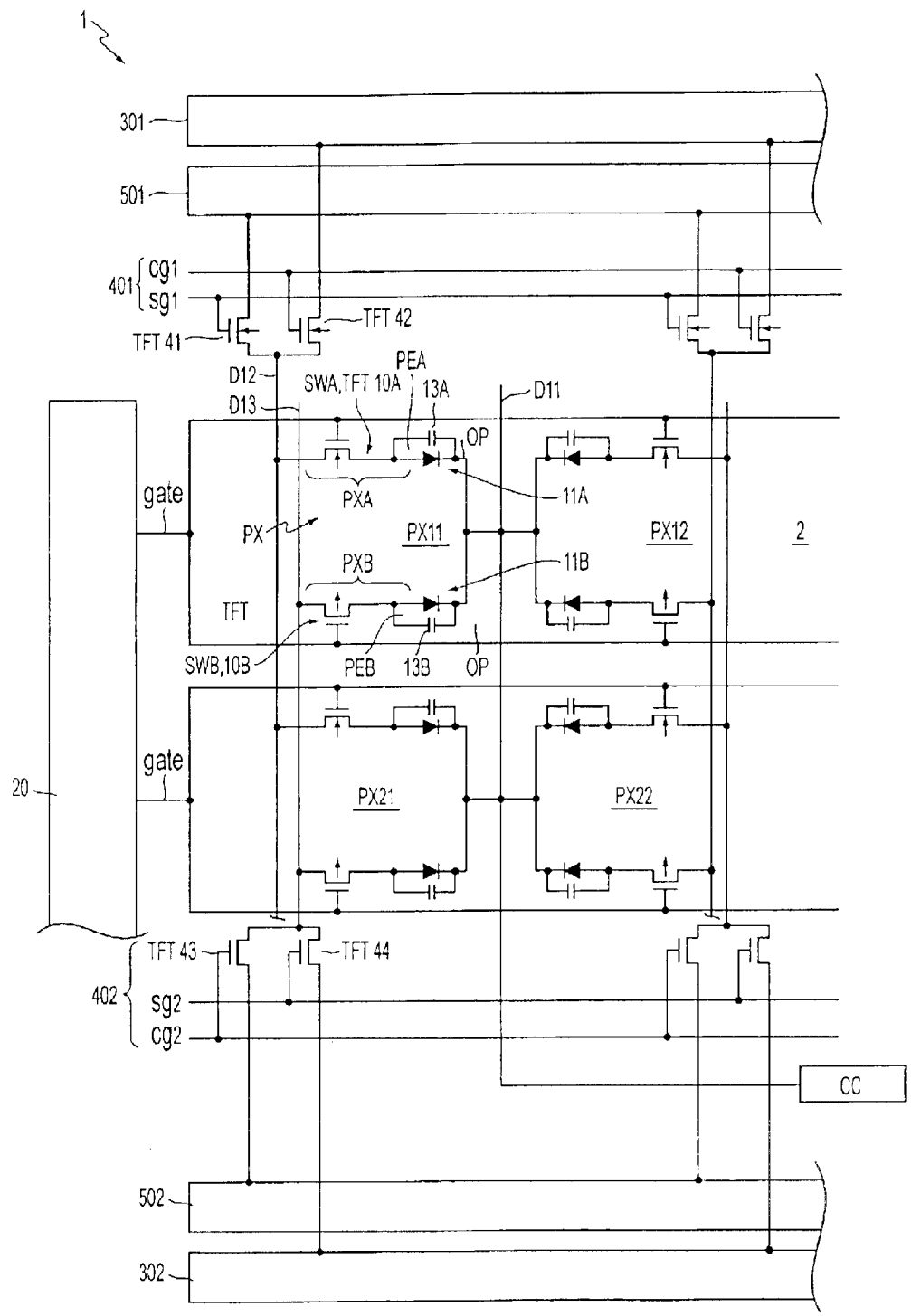
FIG. 1 is an equivalent circuit diagram of an active matrix used for an image sensor apparatus having an additional display device function according to a first embodiment of the present invention.
Figure 2:
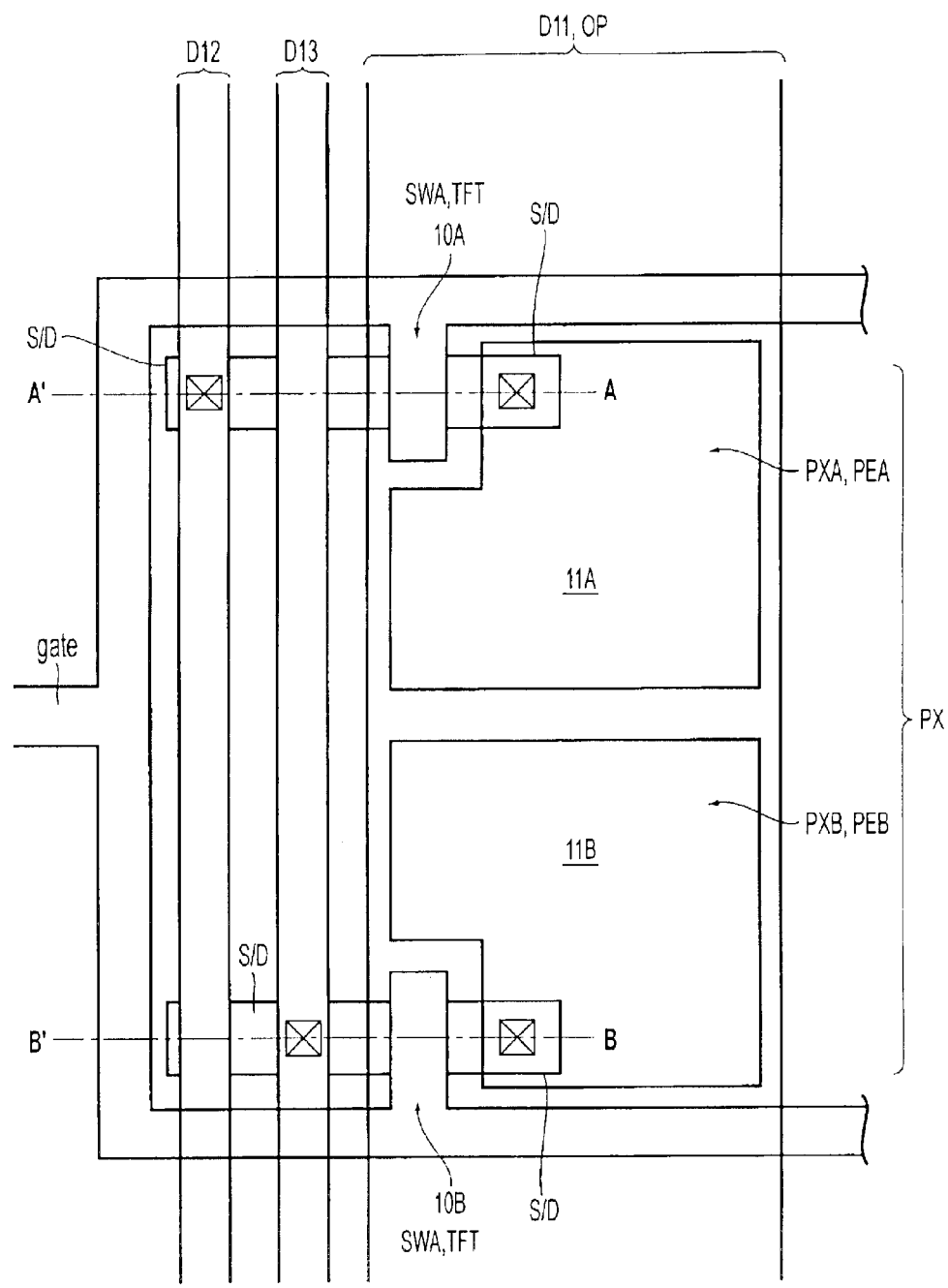
FIG. 2 is an enlarged plan view showing one of a plurality of pixels formed in an active matrix of the image sensor apparatus having an additional display device function shown in FIG. 1.

An active-matrix substrate used in the image sensor apparatus having an additional display device function of this embodiment is manufactured by a semiconductor process in a manner similar to that for an active-matrix substrate of a liquid-crystal display device. As shown in FIGS. 1 and 2, in an image sensor apparatus 1 having an additional display device function of this embodiment, a plurality of scanning lines "gate" are formed on a transparent substrate 2. In the direction intersecting the direction in which these scanning lines "gate" are extended, a first wiring D11 that functions as a common wiring for supplying voltage, and second and third wirings D12 and D13 that function as a signal line are formed, with each pixel PX (pixels PX11, PX12, PX21, PX22) being formed in matrix in such a manner as to correspond to the intersection portion of the second wiring D12 (or the third wiring D13) and the scanning lines "gate". In the end portion of the scanning line "gate", a scanning-side driving circuit 20 for outputting a pulse for selecting a pixel as a scanning signal to this scanning line "gate" is formed.

(Construction of the Pixel)

As shown in FIGS. 1 to 3(B), in this embodiment, each pixel PX is formed with a first pixel section PXA comprising a first conduction control circuit SWA to which a scanning signal for selecting a pixel is supplied through the scanning line "gate" and a first thin-film optoelectronic transducer 11A which is connected to the first wiring D11 and the second wiring D12 in a circuit manner through the first conduction control circuit SWA; and a second pixel section PXB comprising a second conduction control circuit SWB to which the scanning signal is supplied through the scanning line "gate" for common use with this first pixel section PXA and a second thin-film optoelectronic transducer 11B which is connected to the first wiring D11 and the third wiring D13 in a circuit manner through the second conduction control circuit SWB. Although not shown in FIGS. 2 and 3, in each of the first and second pixel sections PXA and PXB, holding capacitors 13A and 13B are formed in such a manner as to be connected in parallel to the first and second thin-film optoelectronic transducers 11A and 11B.

The first and second conduction control circuits SWA and SWB are formed of p-channel-type TFTs 10A and 10B including a gate electrode to which a scanning signal is supplied from the scanning line "gate", respectively. The TFT 10A on the side of the first conduction control circuit SWA is connected at one of its source and drain regions S/D to the second wiring D12 and connected at the other to a pixel electrode PEA of the first thin-film optoelectronic transducer 11A. The TFT 10B on the side of the second conduction control circuit SWB is connected at one of its source/drain regions S/D to the third wiring D13 and connected at the other to a pixel electrode PEB of the second thin-film optoelectronic transducer 11B.

Figure 3A:
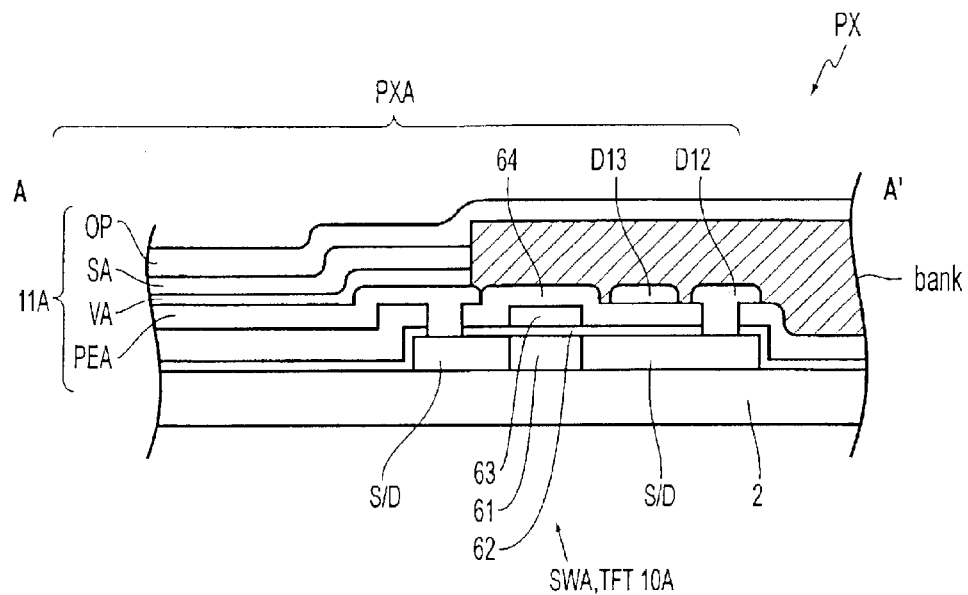
FIGS. 3(A) and 3(B) are each a sectional view showing the construction of each element formed in the pixel shown in FIG. 2.
Figure 3B:
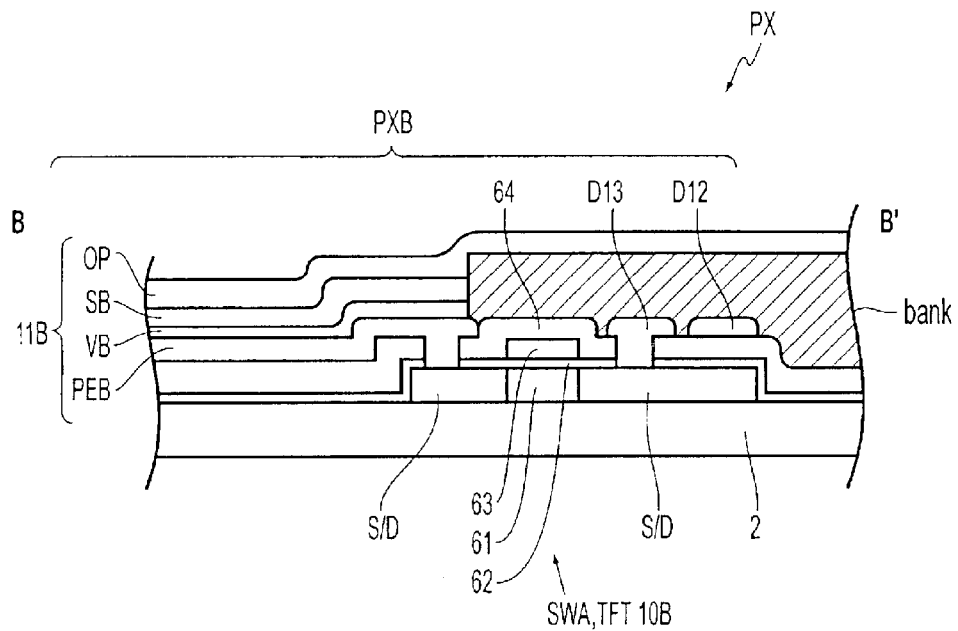

FIGS. 3(A) and 3(B) show a section along the line A–A' of FIG. 2 and a section along the line B–B' of FIG. 2, respectively. As shown in FIGS. 3(A) and 3(B), the basic constructions of the first and second pixel sections PXA and PXB are the same, and the TFTs 10A and 10B which constitute the first and second conduction control circuits SWA and SWB are each formed with a channel region 61, source/drain regions S/D formed on both sides of the channel region 61, a gate insulation film 62 formed at least on the surface of the channel region 61, and a gate electrode 63 formed on the surface of this gate insulation film 62, with an interlayer insulation film 64 being formed on the surface of the gate electrode 63. The second and third wirings D12 and D 13 are connected electrically to one of the source/drain regions S/D, respectively, through the contact hole of this interlayer insulation film 64. The pixel electrodes PEA and PEB of the first and second thin-film optoelectronic transducers 11A and 11B are connected electrically to the other of the source/drain regions S/D, respectively. Although not shown in FIG. 3(B), in each of the first and second pixel sections PXA and PXB, holding capacitors 13A and 13B which are connected in parallel to the first and second thin-film optoelectronic transducers 11A and 11B are formed, as described with reference to FIG. 1. These holding capacitors 13A and 13B can be formed by extending, for example, the pixel electrodes PEA and PEB or that part of the source/drain regions S/D, which is connected electrically to the pixel electrodes PEA and PEB, and by causing them to oppose a counter electrode OP through the insulation film. It is also possible to form the holding capacitors 13A and 13B by forming a capacitance line in such a manner so as to pass through the first and second pixel sections PXA and PXB and by causing this capacitance line to oppose the extended portion of the source/drain regions S/D or the pixel electrodes PEA and PEB through the insulation film. In this case, the capacitance line is set at a fixed potential.

(Thin-Film Optoelectronic Transducer)

The first and second thin-film optoelectronic transducers 11A and 11B have the same construction and function as either a light-emitting element or a light-receiving element. That is, in the first thin-film optoelectronic transducer 11A, a transparent pixel electrode PEA formed of an ITO film, a positive-hole injection layer VA, an organic semiconductor film SA, and a counter electrode OP formed of a lithium-containing metal film such as aluminum or calcium are multilayered in this sequence. Also in the second thin-film optoelectronic transducer 11B, similarly, a transparent pixel electrode PEB formed of an ITO film, a positive-hole injection layer VB, an organic semiconductor film SB, and a counter electrode OP formed of a lithium-containing metal film such as aluminum or calcium are multilayered in this sequence, each of these layers being a layer formed at the same time as the pixel electrode PEA, the positive-hole injection layer VA, the organic semiconductor film SA, and the counter electrode OP of the first thin-film optoelectronic transducer 11A.

A case in which the thin-film optoelectronic transducer functions as a light-emitting element will be described first. In the first and second thin-film optoelectronic transducers 11A and 11B, since these are used as light-emitting elements (current-control-type light-emitting elements), when a voltage is applied by assigning the counter electrode OP and the pixel electrodes PEA and PEB as a negative pole and a positive pole, respectively, current (driving current) which flows through the organic semiconductor films SA and SB increases sharply in a state in which the applied voltage exceeds a threshold voltage of the thin-film optoelectronic transducer, causing the first and second thin-film optoelectronic transducers 11A and 11B to emit light as an EL element or an LED element. This light is reflected by the counter electrode OP, passes through the transparent pixel electrodes PEA and PEB, and is output.

Next, a case in which the thin-film optoelectronic transducer functions as a light-receiving element will be described. When light reaches the first and second thin-film optoelectronic transducers 11A and 11B through the transparent substrate 2 and the transparent pixel electrodes PEA and PEB, photocurrent is generated in the organic semiconductor films SA and SB. In this case, the thin-film optoelectronic transducer functions as a light-receiving element that generates a potential difference between the counter electrode OP and the pixel electrodes PEA and PEB.

When manufacturing the first and second thin-film optoelectronic transducers 11A and 11B of such a construction, in this embodiment, after a black resist layer is formed on the surface of the interlayer insulation film 64, the positive-hole injection layers VA and VB and the organic semiconductor films SA and SB are formed, the resist is left in such a manner as to surround the area which is to be the light-emitting area or the light-receiving area, and a bank layer "bank" is formed. After the bank layer "bank" is formed, a liquid material (precursor) for forming the positive-hole injection layers VA and VB is discharged from an ink jet head with respect to the inner area of the bank layer "bank", and the positive-hole injection layers VA and VB are formed in the inner area of the bank layer "bank". Similarly, a liquid material (precursor) for forming the organic semiconductor films SA and SB is discharged from the ink jet head with respect to the inner area of the bank layer "bank", and the organic semiconductor films SA and SB are formed in the inner area of the bank layer "bank". Here, since the bank layer "bank" is formed of a resist, it is water-repellent. In contrast, since the precursors of the positive-hole injection layers VA and VB and the organic semiconductor films SA and SB use a hydrophilic solvent as a main solvent, the coating areas of the positive-hole injection layers VA and VB and the organic semiconductor films SA and SB are surely defined by the bank layer "bank", and do not extend out to the adjacent pixel section. Therefore, it is possible to form the positive-hole injection layers VA and VB and the organic semiconductor films SA and SB only within the predetermined area. Further, a bank layer "bank" having a light-shielding property (light-shielding layer) is formed between the pixel electrode PEA of the first pixel section PXA and the pixel electrode PEB of the second pixel section PXB. However, if the barrier plate formed of the bank layer "bank" has a height of about 1 μm in advance, the bank layer "bank" functions sufficiently as a barrier plate even if the bank layer "bank" is not water-repellent. If the bank layer "bank" is formed in advance, even when the positive-hole injection layers VA and VB and the organic semiconductor films SA and SB are formed by a coating method instead of an ink jet method, the formation area thereof can be defined.

In the thin-film optoelectronic transducers 11A and 11B, although light emission efficiency is slightly decreased, there is a case in which the positive-hole injection layers VA and VB are omitted. Further, when an electron injection layer is formed on the opposite side of the organic semiconductor films SA and SB in place of the positive-hole injection layers VA and VB, there is a case in which both the electron injection layer and the positive-hole injection layers VA and VB are formed.

(Driving Circuit)

As can be seen from FIG. 2, the counter electrode OP is formed at least on the pixel area, and in this embodiment, is formed in strip in such a manner as to extend across a plurality of pixels PX as a common electrode among the pixels PX. As shown in FIG. 1, this counter electrode OP itself is used as the first wiring D11, and it is connected to a constant-voltage power source cc.

In this embodiment, the construction is formed as described below such that in all the pixels PX, the first thin-film optoelectronic transducer 11A and the second thin-film optoelectronic transducer 11B can be used as a light-emitting element or a light-receiving element, and one of the optoelectronic transducer 11A and the second thin-film optoelectronic transducer 11B can be used as a light-emitting element and the other as a light-receiving element.

Referring again to FIG. 1, a first data-side driving circuit 301 for outputting a signal for controlling the switched on/off state to the second wiring D12, and a second data-side driving circuit 302 for outputting a signal for controlling the switched on/off state to the third wiring D13 are formed on the transparent substrate 2. Also formed on the transparent substrate 2 are a first photocurrent detection circuit 501 for detecting photocurrent from the second wiring D12 which flows when the first thin-film optoelectronic transducer 11A receives light, and a second photocurrent detection circuit 502 for detecting photocurrent from the third wiring D13 which flows when the second thin-film optoelectronic transducer 11B receives light. Here, the first photocurrent detection circuit 501 and the second photocurrent detection circuit 502 contain therein a very-small-current amplification circuit, a voltage amplification circuit, and the like, so that a very small variation of each wiring is monitored.

(Switching Circuit)

Also, as shown in FIG. 1, formed on the transparent substrate 2 are a first switching circuit 401 that connects the second wiring D12 to the first data-side driving circuit 301 when the first thin-film optoelectronic transducer 11A is used as a light-emitting element and that connects the second wiring D12 to the first photocurrent detection circuit 501 when the first thin-film optoelectronic transducer 11A is used as a light-receiving element, and a second switching circuit 402 that connects the third wiring D13 to the second data-side driving circuit 302 when the second thin-film optoelectronic transducer 11B is used as a light-emitting element and that connects the third wiring D13 to the second photocurrent detection circuit 502 when the second thin-film optoelectronic transducer 11B is used as a light-receiving element.

In this example, the first switching circuit 401 is formed with signal lines cg1 and sg1 to which the signals whose polarity is inverted with respect to the other are respectively supplied, and the second switching circuit 402 is formed with signal lines cg2 and sg2 to which the signals whose polarity is inverted with respect to the other are respectively supplied. These signal lines cg1, sg1, cg2, and sg2 are connected to the gate electrodes of n-channel-type TFTs 41, 42, 43, and 44, respectively. The TFT 41 is constructed so as to control the connected state of the first photocurrent detection circuit 501 and the second wiring D12, and the TFT 42 is constructed so as to control the connected state of the first data-side driving circuit 301 and the second wiring D12. Similarly, the TFT 43 is constructed so as to control the connected state of the second photocurrent detection circuit 502 and the third wiring D13, and the TFT 44 is constructed so as to control the connected state of the second data-side driving circuit 302 and the third wiring D13.

(Method of Use)

When the image sensor apparatus 1 having an additional display device function constructed as described above is used as a contact-type image sensor apparatus, a readout object, such as a photograph, from which an image is to be read, is brought into close contact with the rear surface of the transparent substrate 2. Here, in each pixel PX, when the first thin-film optoelectronic transducer 11A is used as a light-emitting element and the second thin-film optoelectronic transducer 11B as a light-receiving element, the first switching circuit 401 causes the TFT 41 to be turned off and the TFT 42 to be turned on. In contrast, the second switching circuit 402 causes the TFT 43 to be turned on and the TFT 44 to be turned off.

Figure 4A:
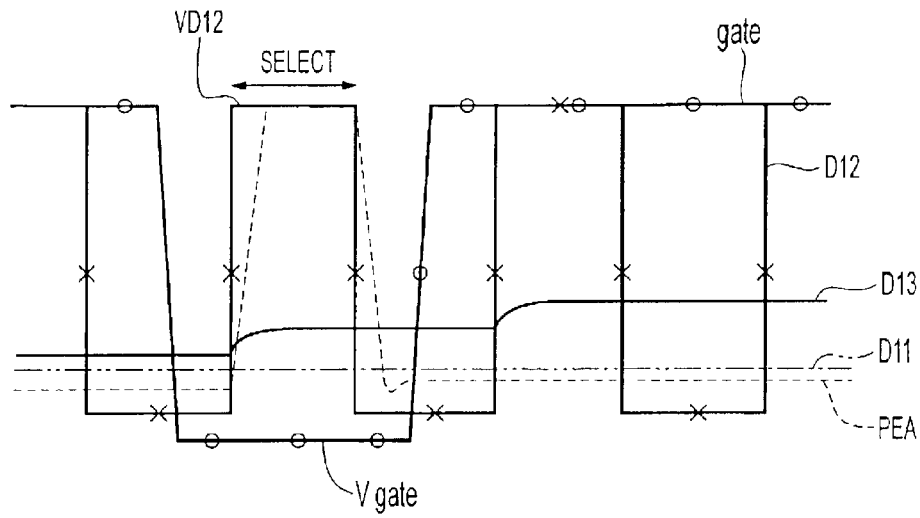
FIGS. 4(A) and 4(B) are each a waveform chart of a scanning signal and the like supplied to two adjacent pixels in the active matrix of the image sensor apparatus having an additional display device function shown in FIG. 1.
Figure 4B:
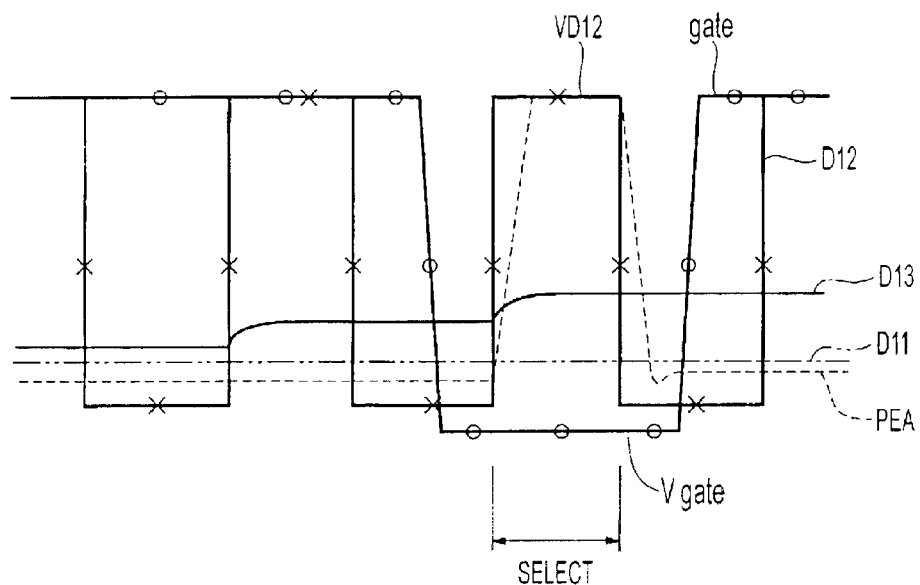

In this state, the signals of waveforms shown in FIGS. 4(A) and 4(B) are output to the scanning line "gate" and the second wiring D12.

FIGS. 4(A) and 4(B) show a scanning signal Vgate supplied to each scanning line "gate" in two adjacent pixels PX (the pixel PX11 on the pre-stage side, and the pixel PX21 on the post-stage side) in the directions in which the first to third wirings D11, D12, and D13 are extended (the direction intersecting the scanning line "gate"), the potential level of the first wiring D11, a signal VD12 for controlling the switch on/off, which is supplied to the second wiring D12, the potential fluctuation of the third wiring D13, and the potential fluctuation of the pixel electrode PEA of the first thin-film optoelectronic transducer 11A used as a light-emitting element.

As can be seen from FIGS. 4(A)–(B), a scanning signal Vgate for causing the TFTs 10A and 10B to be turned on/off in each pixel and selecting each pixel in sequence is supplied to the scanning line "gate", whereas a switch on/off control signal VD12 for switching the first thin-film optoelectronic transducer 11A between switched on and off states in the first pixel section PXA is supplied to the second wiring D12. Therefore, in the pixel PX selected by the scanning line "gate", the first thin-film optoelectronic transducer 11A is switched from the switched-off state to the switched-on state for a predetermined period in accordance with the switch on/off control signal VD12 in the first pixel section PXA and returns to a switched-off state again. In this period, in the second pixel section PXB, the second thin-film optoelectronic transducer 11B receives the light which is reflected by a readout object, such as a photograph, from the first pixel section PXA. As a result, photocurrent flows in the second thin-film optoelectronic transducer 11B, and in accordance with this, a predetermined potential difference is generated between the pixel electrode PEB of the second thin-film optoelectronic transducer 11B and the counter electrode OP. Since this potential difference appears in the third wiring D13, this can be detected in sequence by the second photocurrent detection circuit 502. Such an operation is performed by each pixel selected in sequence in accordance with a scanning signal output to the scanning line "gate" from the scanning-side driving circuit 20. Therefore, it is possible for the image sensor apparatus 1 having an additional display device function as a contact-type image sensor apparatus to read image information from a readout object, such as a photograph.

The image information read in this way and the like can be displayed by the image sensor apparatus 1 having an additional display device function. That is, the image information read herein from a readout object, such as a photograph, is recorded in an information recording device, such as a RAM, and when it is displayed, a modulation image signal in accordance with the image information is sent to the second wiring D12 from the first data-side driving circuit 301. As a result, in the pixel PX selected in sequence by a scanning signal supplied from the scanning line "gate", the switched on/off state of the first thin-film optoelectronic transducer 11A of the first pixel section PXA is controlled in accordance with the modulation image signal, and a desired image is displayed.

When such a display operation is performed, if the second switching circuit 402 causes the TFT 43 to be turned off and the TFT 44 to be turned on and the modulation image signal is sent from the second data-side driving circuit 302 to the third wiring D13, it is also possible for the second thin-film optoelectronic transducer 11B of the second pixel section PXB to control the switched on/off state in accordance with the modulation image signal. When the display operation is performed by both the first and second pixel sections PXA and PXB as described above, it is possible to produce a display having higher luminance.

In contrast to the above example, if the first and second switching circuits 401 and 402 cause the TFTs 41 and 43 to be turned on and the TFTs 42 and 44 to be turned off, it is possible to use the respective first and second thin-film optoelectronic transducers 11A and 11B as a light-receiving element in both the first and second pixel sections PXA and PXB. As a result of the above, a reading operation with higher sensitivity is possible.

(Advantages of this Embodiment)

As has been described above, in the image sensor apparatus 1 having an additional display device function of this embodiment, since each pixel PX is formed with the first and second thin-film optoelectronic transducers 11A and 11B that function as a light-emitting element and a light-receiving element, by only changing the method of driving these thin-film optoelectronic transducers, it is possible to use the image sensor apparatus 1 having an additional display device function as an image sensor apparatus and a display device. Further, in the image sensor apparatus 1 having an additional display device function of this embodiment, each element can be manufactured by a semiconductor process and since an optical system, a mechanical system, sensors, illumination, and the like, which are expensive, are not required, the readout section and the like of a facsimile machine can be lowered in price.

Furthermore, by only switching the connected state of the second and third wirings D12 and D13 by the switching circuits 401 and 402, it is possible to cause both the first and second pixel sections PXA and PXB to function as a light-emitting section or a light-receiving section, and it is also possible to cause one of them to function as a light-emitting section and the other to function as a light-receiving section.

Since a light-shielding bank layer "bank" is formed between the pixel electrode PEA of the first pixel section PXA and the pixel electrode PEB of the second pixel section PXB, even if light is emitted in all directions from the side of the first pixel section PXA which functions as a light-emitting section, it is possible for the bank layer "bank" to prevent the light from leaking to the second pixel section PXB which functions as a light-receiving section. Therefore, it is possible to read an image from a readout object at a high S/N ratio.

[Second Embodiment]

(Overall Construction of Active-Matrix Substrate)

FIGS. 5 to 8(B) are respectively an equivalent circuit diagram of an active matrix used for an image sensor apparatus having an additional display device function, an enlarged plan view showing one of a plurality of pixels formed in this active matrix, sectional views showing the construction of each element formed in this pixel, and waveform charts showing potential fluctuation in two pixels. In the following description, components having functions common to those of the first embodiment are given the same reference numerals, and accordingly, a detailed description thereof has been omitted.

Figure 5:
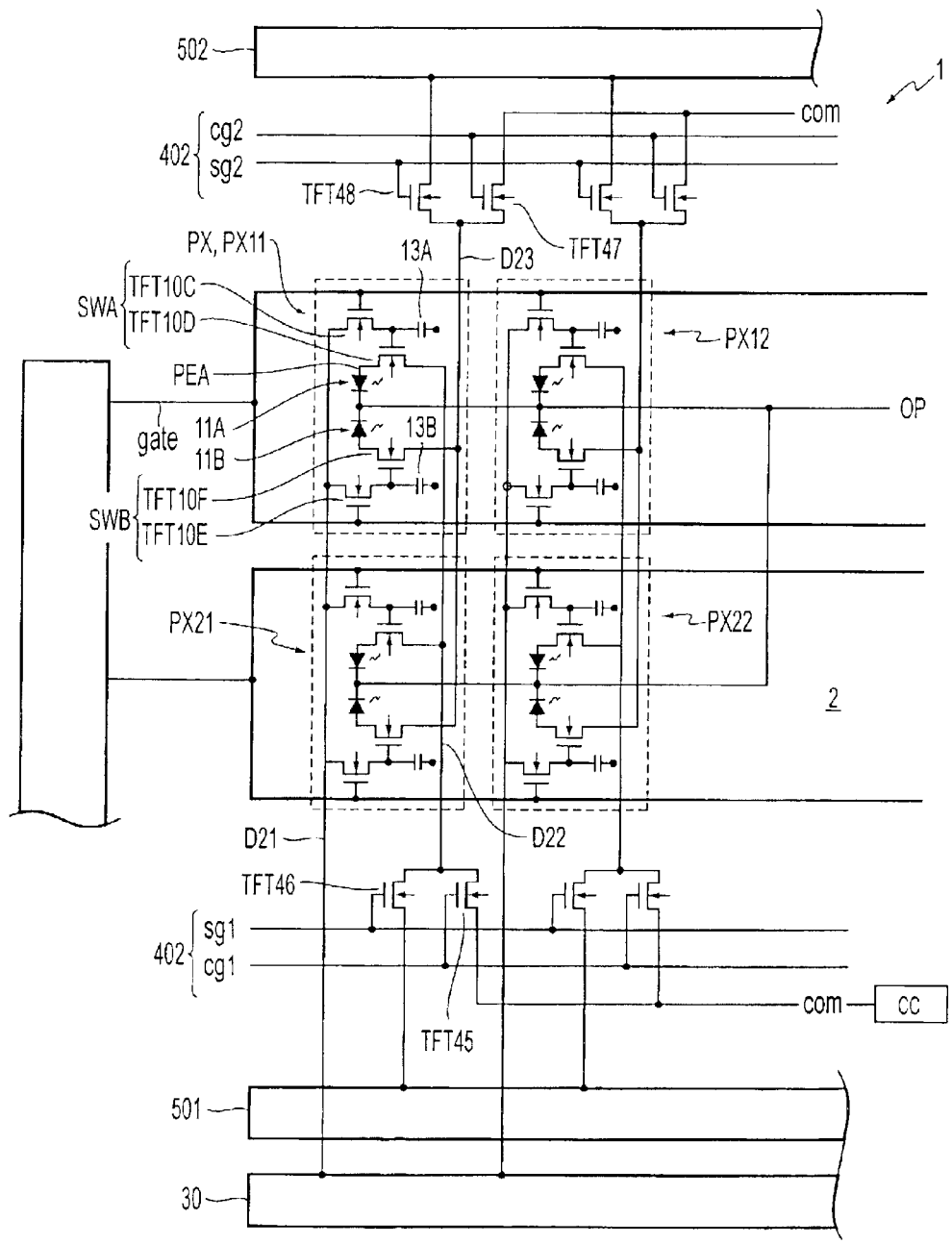
FIG. 5 is an equivalent circuit diagram of an active matrix used for an image sensor apparatus having an additional display device function according to a second embodiment of the present invention.
Figure 6:
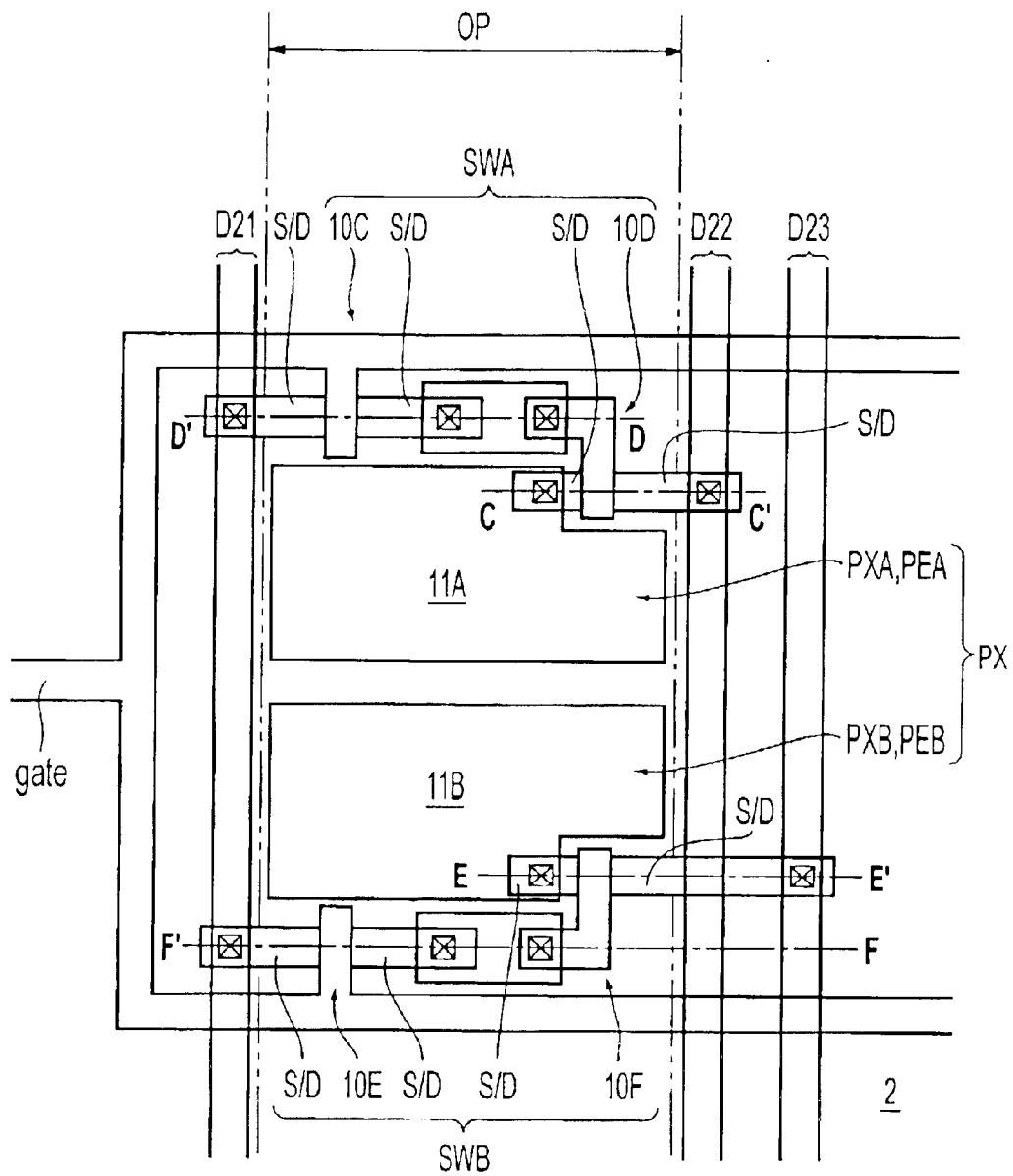
FIG. 6 is an enlarged plan view showing one of a plurality of pixels formed in an active matrix of the image sensor apparatus having an additional display device function shown in FIG. 5.

An active-matrix substrate is also manufactured by a semiconductor process in a manner similar to that for an active-matrix substrate of a liquid-crystal display device used for an image sensor apparatus having an additional display device function of this embodiment. As shown in FIGS. 5 and 6, also in the image sensor apparatus 1 having an additional display device function of this embodiment, on a transparent substrate 2, a first wiring D21, a second wiring D22, and a third wiring D23 are formed in the direction intersecting the direction in which the scanning lines "gate" extend, with each pixel PX (pixels PX11, PX12, PX21, PX22) being formed in matrix as a result of the intersection of the first to third wirings D21, D22, and D23 and the scanning lines "gate". Further, a counter electrode OP is formed at least on the pixel region, and also in this embodiment, is formed in strip in such a manner as to extend across a plurality of pixels PX as a common electrode among the pixels PX.

(Construction of the Pixel)

As shown in FIGS. 5 to 8(B), each of the pixels PX is formed with first and second pixel sections PXA and PXB. The first pixel section PXA is formed with a first conduction control circuit SWA to which a scanning signal for selecting pixels is supplied through the scanning line "gate" and a first thin-film optoelectronic transducer 11A in which one of the electrodes (pixel electrode PEA) is connected through this first conduction control circuit SWA in a circuit manner to both the first wiring D21 and the second wiring D22. Also, the second pixel section PXB is formed with a second conduction control circuit SWB to which the scanning signal is supplied through the scanning line "gate" for common use with the first pixel section PXA which, together this pixel section, constitutes one pixel PX, and a second thin-film optoelectronic transducer 11B in which one of the electrodes (pixel electrode PEB) is connected through this second conduction control circuit SWB in a circuit manner to both the first wiring D21 and the third wiring D23. Here, in the first and second thin-film optoelectronic transducers 11A and 11B, the other electrode is formed as a counter electrode OP for common use.

The first and second conduction control circuits SWA and SWB include TFTs 10C and 10E in which a scanning signal is supplied to the gate electrode, and second TFTs 10D and 10F in which the gate electrode is connected to the first wiring D21 through these first TFTs 10C and 10E, respectively. In this example, the TFTs 10C and 10E are of an n-channel type, and the TFTs 10D and 10F are of a p-channel type. The second TFT 10D of the first conduction control circuit SWA is connected at one of its source and drain regions S/D to the second wiring D22 and connected at the other to the pixel electrode PEA of the first thin-film optoelectronic transducer 11A. The TFT 10F of the second conduction control circuit SWB is connected at one of its source and drain regions S/D to the third wiring D23 and connected at the other to the pixel electrode PEB of the second thin-film optoelectronic transducer 11B. Although not shown in FIGS. 6, 7(A) and 7(B), in each of the first and second pixel sections PXA and PXB, one of the electrodes of the holding capacitors 13A and 13B is connected to the gate electrodes of the second TFTs 10D and 10F so as to perform the function of holding the electrical potential applied to the gate electrode.

Figure 7A:
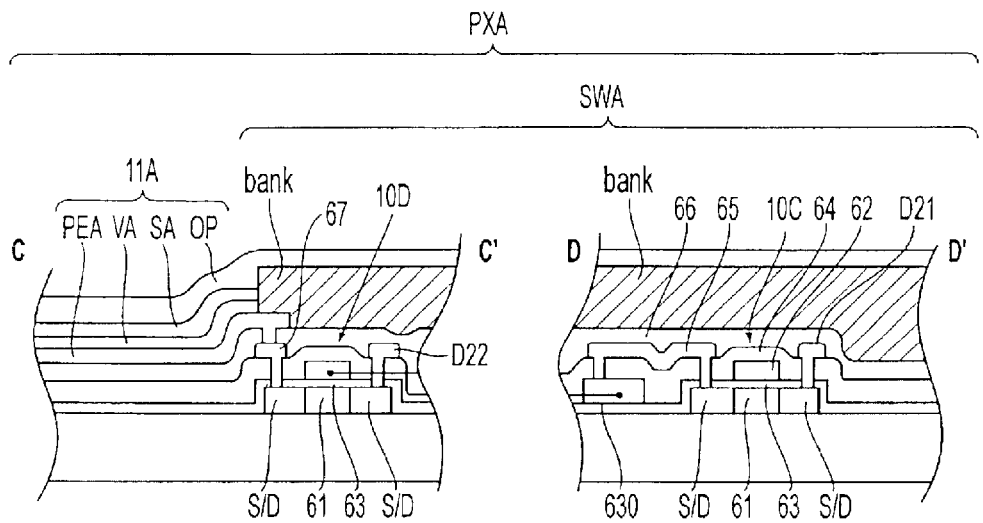
FIGS. 7(A) and 7(B) are each a sectional view showing the construction of each element formed in the pixel shown in FIG. 6.
Figure 7B:
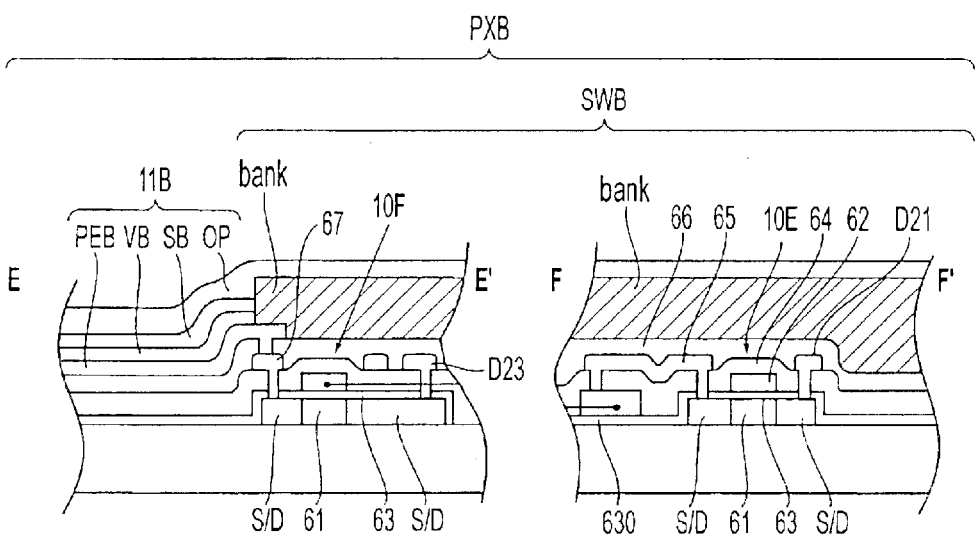

As the sections along the line C–C' and along the line D–D' of FIG. 6 and the sections along the line E–E' and along the line F–F' of FIG. 6 are shown in FIGS. 7(A) and 7(B), respectively, the basic constructions of the first and second pixel sections PXA and PXB are the same. The first TFTs 10C and 10E and the second TFTs 10D and 10F which constitute the first and second conduction control circuits SWA and SWB are each formed with a channel region 61, source/drain regions S/D formed on both sides of this channel region 61, a gate insulation film 62 formed at least on the surface of the channel region 61, a gate electrode 63 formed on the surface of this gate insulation film 62, and a first interlayer insulation film 64 formed on the surface of this gate electrode 63.

In the first TFTs 10C and 10E which are constituents of the first and second conduction control circuits SWA and SWB, the first wiring D21 is electrically connected to one of the source/drain regions S/D through the contact hole of the interlayer insulation film 64. A potential holding electrode 65 is electrically connected to the other of the source/drain regions S/D of the TFTs 10C and 10E through the contact hole of the interlayer insulation film 64, and this potential holding electrode 65 is electrically connected to the extended portion 630 of the gate electrode 63 of the second TFTs 10D and 10F.

A second interlayer insulation film 66 is formed on the surfaces of the potential holding electrode 65 and the first wiring D21.

In the second TFT 10D which is a constituent of the first conduction control circuit SWA, the second wiring D22 is electrically connected to one of the source/drain regions S/D through the contact hole of the interlayer insulation film 64. In the second TFT 10F which is a constituent of the second conduction control circuit SWB, the third wiring D23 is electrically connected to one of the source/drain regions S/D through the contact hole of the interlayer insulation film 64. A relay electrode 67 is electrically connected to the other of the source/drain regions S/D of the second TFTs 10D and 10F through the contact hole of the interlayer insulation film 64, and the pixel electrodes PEA and PEB are electrically connected to this relay electrode 67 through the contact hole of the interlayer insulation film 66.

Although not shown in FIGS. 7(A)–(B), as described with reference to FIGS. 4(A)–(B), in each of the first and second pixel sections PXA and PXB, one of the electrodes of the holding capacitors 13A and 13B is connected to the gate electrode 63 of the first TFTs 10C and 10E. For example, the gate electrodes 63 of the second TFTs 10D and 10F extend to below the second wiring D22 or the third wiring D23 and are made to oppose each other via the interlayer insulation film 64. These holding capacitors 13A and 13B may be formed in such a way that, for example, a capacitance line is formed in such a manner as to pass the first and second pixel sections PXA and PXB and this capacitance line is made to oppose the potential holding electrode 65 through the interlayer insulation film 64. In this case, the capacitance line is held at a fixed potential.

(Thin-Film Optoelectronic Transducer)

The first and second thin-film optoelectronic transducers 11A and 11B have the same construction, as described in the first embodiment, and may function as either a light-emitting element or a light-receiving element. That is, in the first and second thin-film optoelectronic transducers 11A and 11B, transparent pixel electrodes PEA and PEB formed of an ITO film, positive-hole injection layers VA and VB, organic semiconductor films SA and SB, and a counter electrode OP formed of a lithium-containing metal film such as aluminum or calcium are multilayered in this sequence, each of these layers being a layer formed at the same time as on the side of the first thin-film optoelectronic transducer 11A and the side of the second thin-film optoelectronic transducer 11B.

A case in which the thin-film optoelectronic transducer functions as a light-emitting element will be described first. In the first and second thin-film optoelectronic transducers 11A and 11B, since these are used as light-emitting elements, when a voltage is applied by assigning the counter electrode OP and the pixel electrodes PEA and PEB as a negative pole and a positive pole, respectively, current (driving current) which flows through the organic semiconductor films SA and SB increases sharply in a state in which the applied voltage exceeds a threshold voltage of the thin-film optoelectronic transducer, causing the first and second thin-film optoelectronic transducers 11A and 11B to emit light as an EL element or an LED element. This light is reflected by the counter electrode OP, and is output through the transparent pixel electrodes PEA and PEB and the transparent substrate 2.

A case in which the thin-film optoelectronic transducer functions as a light-receiving element will be described. When light reaches the first and second thin-film optoelectronic transducers 11A and 11B through the transparent substrate 2 and the transparent pixel electrodes PEA and PEB, photocurrent is generated in the organic semiconductor films SA and SB. In this case, the thin-film optoelectronic transducer functions as a light-receiving element which generates a potential difference between the counter electrode OP and the pixel electrodes PEA and PEB.

When manufacturing the first and second thin-film optoelectronic transducers 11A and 11B of such a construction, similarly to the first embodiment, after a black resist layer is formed on the surface of the interlayer insulation film 66, positive-hole injection layers VA and VB and organic semiconductor films SA and SB are formed, the resist is left in such a manner as to surround the area which is to be the light-emitting area or the light-receiving area, and a bank layer "bank" is formed. After the bank layer "bank" is formed, a liquid material (precursor) for forming the positive-hole injection layers VA and VB is discharged from an ink jet head with respect to the inner area of the bank layer "bank", and the positive-hole injection layers VA and VB are formed in the inner area of the bank layer "bank". Similarly, a liquid material (precursor) for forming the organic semiconductor films SA and SB is discharged from the ink jet head with respect to the inner area of the bank layer "bank", and the organic semiconductor films SA and SB are formed in the inner area of the bank layer "bank". As a result, a light-shielding bank layer "bank" is formed between the pixel electrode PEA of the first pixel section PXA and the pixel electrode PEB of the second pixel section PXB.

Further, in the first and second thin-film optoelectronic transducers 11A and 11B, the transparent pixel electrode PEA or PEB formed of ITO, the positive-hole injection layer VA, and the organic semiconductor film SA as a light-emission thin film are multilayered, and further, a counter electrode OP formed of a lithium-containing metal film such as aluminum or calcium is formed on the surface of the organic semiconductor film SA in this sequence. In contrast, when a driving current is made to flow in a reverse direction to the first and second thin-film optoelectronic transducers, there is a case in which, from the lower layer side toward the upper layer side, a pixel electrode PEA or PEB formed of an ITO film, a counter electrode OP formed of a lithium-containing aluminum electrode, which is so thin as to have a light transmission property, an organic semiconductor film SA, a positive-hole injection layer VA, and a counter electrode OP (positive pole) formed of a lithium-containing metal film such as aluminum or calcium are multilayered in this sequence, forming a light-emitting element 40.

(Driving Circuit)

As can be seen from FIG. 6, the counter electrode OP is formed at least on the pixel area, and is formed in strip in such a manner so as to extend across a plurality of pixels PX as a common electrode among the pixels PX. The counter electrode OP is held at a fixed potential.

In this embodiment, the construction is formed as described below such that in all the pixels PX, the first and second thin-film optoelectronic transducers 11A and 11B can be used as a light-emitting element or a light-receiving element, and one of the first and second thin-film optoelectronic transducers 11A and 11B can be used as a light-emitting element and the other as a light-receiving element.

Referring again to FIG. 5, a data-side driving circuit 30 for outputting a signal for controlling the switched on/off state and a signal for controlling the light-receiving/non-light-receiving state to the first wiring D21 is formed on the transparent substrate 2. Also formed on the transparent substrate 2 are a first photocurrent detection circuit 501 for detecting photocurrent from the second wiring D22 which flows when the first thin-film optoelectronic transducer 11A receives light, and a second photocurrent detection circuit 502 for detecting photocurrent from the third wiring D23 which flows when the second thin-film optoelectronic transducer 11B receives light. Here, the first photocurrent detection circuit 501 and the second photocurrent detection circuit 502 contain a very-small-current amplification circuit, a voltage amplification circuit, and the like therein, so that a very small variation of each wiring is monitored.

(Switching Circuit)

As shown in FIG. 5, formed on the transparent substrate 2 are a first switching circuit 401 which connects the second wiring D22 to a common power-supply line com when the first thin-film optoelectronic transducer 11A is used as a light-emitting element and which connects the second wiring D22 to the first photocurrent detection circuit 501 when the first thin-film optoelectronic transducer 11A is used as a light-receiving element, and a second switching circuit 402 which connects the third wiring D23 to the common power-supply line com when the second thin-film optoelectronic transducer 11B is used as a light-emitting element and which connects the third wiring D23 to the second photocurrent detection circuit 502 when the second thin-film optoelectronic transducer 11B is used as a light-receiving element.

In this example, the first switching circuit 401 is formed by signal lines cg1 and sg1 to which two signals whose high level and low level are inverted with respect to the other are respectively supplied, and the second switching circuit 402 is formed by signal lines cg2 and sg2 to which two signals whose high level and low level are inverted with respect to the other are respectively supplied. These signal lines cg1, sg1, cg2, and sg2 are connected to the gate electrodes of n-channel-type TFTs 45, 46, 47, and 48, respectively. Here, the TFT 45 is constructed so as to control the connected state of the common power-supply line com and the second wiring D22, and the TFT 46 is constructed so as to control the connected state of the first photocurrent detection circuit 501 and the second wiring D22. Similarly, the TFT 47 is constructed so as to control the connected state of the common power-supply line com and the third wiring D23, and the TFT 48 is constructed so as to control the connected state of the second photocurrent detection circuit 502 and the third wiring D23.

(Method of Use)

When the image sensor apparatus 1 having an additional display device function constructed as described above is used as a contact-type image sensor apparatus, a readout object, such as a photograph, from which an image is to be read, is brought into close contact with the rear surface of the transparent substrate 2. Here, in each pixel PX, when the first thin-film optoelectronic transducer 11A is used as a light-emitting element and the second thin-film optoelectronic transducer 11B as a light-receiving element, the first switching circuit 401 causes the TFT 45 to be turned on and the TFT 46 to be turned off. In contrast, the second switching circuit 402 causes the TFT 47 to be turned off and the TFT 48 to be turned on.

Figure 8A:
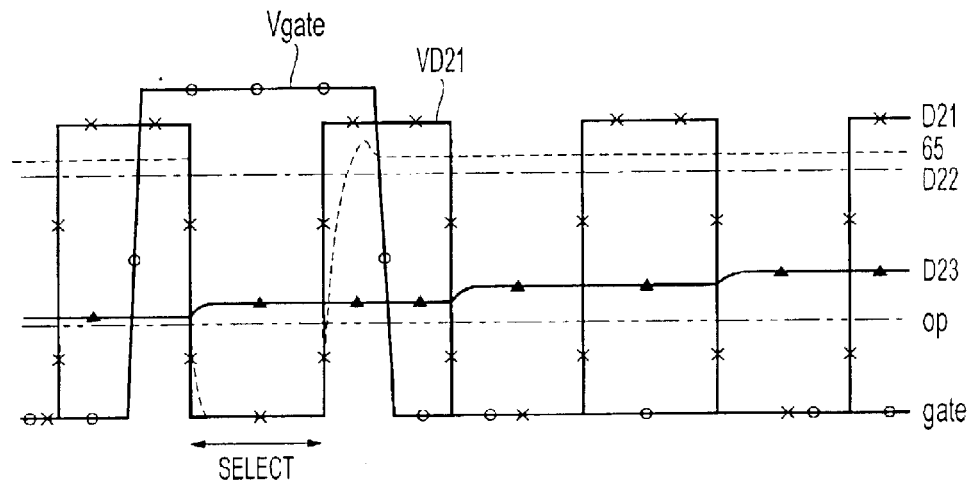
FIGS. 8(A) and 8(B) are each a waveform chart of a scanning signal and the like supplied to two adjacent pixels in an active matrix of the image sensor apparatus having an additional display device function shown in FIG. 5.
Figure 8B:
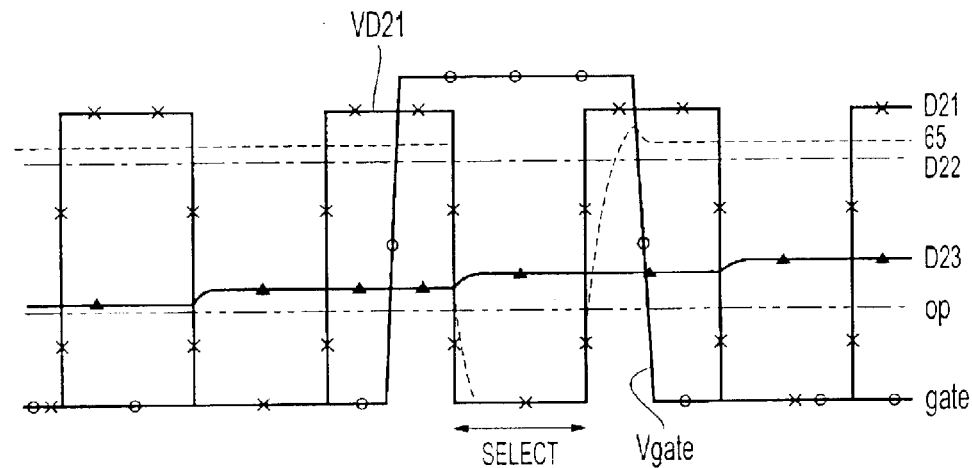

In this state, the signals of waveforms shown in FIGS. 8(A) and 8(B) are output to the scanning line "gate" and the first wiring D21.

FIGS. 8(A) and 8(B) show a scanning signal Vgate supplied to each scanning line "gate" in two adjacent pixels PX (the pixel PX11 on the pre-stage side, and the pixel PX21 on the post-stage side) in the direction in which the first to third wirings D21, D22, and D23 are extended (the direction orthogonal to the scanning line "gate"), a signal VD12 for controlling the switch on/off (controlling light-reception/ non-light-reception), which is supplied to the first wiring D21, the potential level (the potential level of the common power-supply line com) of the second wiring D22, the potential fluctuation of the third wiring D23, and the potential fluctuation of the potential holding electrodes 65 of the first and second thin-film optoelectronic transducers 11A and 11B, and the potential level of the counter electrode OP.

As can be seen from FIGS. 8(A)–(B), a scanning signal Vgate for causing the first TFTs 10C and 10E to be turned on/off and selecting each pixel in sequence is supplied to the scanning line "gate". Furthermore, a switch on/off control signal VD21 for switching between the first thin-film optoelectronic transducer 11A and the second wiring D22 between a conduction state and an insulation state by turning on/off the second TFT 10D is supplied to the first wiring D21. At the same time, the signal VD21 causes the second TFT 10F to be turned on/off so as to switch between the second thin-film optoelectronic transducer 11B and the third wiring D23 between a conduction state and an insulation state.

Therefore, in the pixel PX selected by the scanning signal Vgate, in the first pixel section PXA, the first thin-film optoelectronic transducer 11A changes from the switched-off state to the switched-on state in accordance with the signal VD21 for switched on/off control, and this switched-on state is maintained. During this period, in the second pixel section PXB, light which is radiated from the first pixel section PXA onto a readout object, such as a photograph, is reflected, and the reflected light is received by the second thin-film optoelectronic transducer 11B. As a result, photocurrent flows in the second thin-film optoelectronic transducer 11B, and in accordance with this, a predetermined potential difference is generated between the pixel electrode PEB of the second thin-film optoelectronic transducer 11B and the counter electrode OP. This potential difference can be detected in sequence by the second photocurrent detection circuit 502 through the third wiring D23. Such an operation is performed in each pixel in sequence in accordance with a scanning signal output to the scanning line "gate" from the scanning-side driving circuit 20. Therefore, it is possible for the image sensor apparatus 1 having an additional display device function as a contact-type image sensor apparatus to read image information from a readout object, such as a photograph.

The image information read in this way and the like can be displayed by the image sensor apparatus 1 having an additional display device function. That is, the image information read herein from a photograph or the like is recorded in an information recording device, such as a RAM, and when it is displayed, a modulation image signal in accordance with the image information is sent to the first wiring D21 from the data-side driving circuit 30. As a result, in the pixel PX selected in sequence by a scanning signal supplied from the scanning line "gate", the switched on/off state of the first thin-film optoelectronic transducer 11A of the first pixel section PXA is controlled in accordance with the modulation image signal, and a desired image is displayed.

When such a display operation is performed, if the second switching circuit 402 causes the TFT 48 to be turned off and the TFT 47 to be turned on and the third wiring D23 is connected to the common power-supply line com, in the pixel PX which is selected in sequence in accordance with the scanning signal supplied from the scanning line "gate", the switched on/off state of the second thin-film optoelectronic transducer 11B of the second pixel section PXB can be controlled in accordance with the modulation image signal sent from the data-side driving circuit 30 to the first wiring D21. When the display operation is performed by both the first and second pixel sections PXA and PXB, it is possible to produce a display having higher luminance.

If the first and second switching circuits 401 and 402 cause the TFTs 46 and 48 to be turned on and the TFTs 45 and 47 to be turned off, it is possible to use each of the first and second thin-film optoelectronic transducers 11A and 11B as a light-receiving element in both the first and second pixel sections PXA and PXB. As a result of the above, a reading operation with higher sensitivity is possible.

(Advantages of this Embodiment)

As has been described above, in the image sensor apparatus 1 having an additional display device function of this embodiment, since each pixel PX is formed with the first and second thin-film optoelectronic transducers 11A and 11B that function as a light-emitting element and a light-receiving element, by only changing the method of driving these thin-film optoelectronic transducers, it is possible to use the image sensor apparatus 1 having an additional display device function as an image sensor apparatus and a display device. Further, in the image sensor apparatus 1 having an additional display device function of this embodiment, each element can be manufactured by a semiconductor process and since an optical system, a mechanical system, sensors, illumination, and the like, which are expensive, are not required, the readout section of a facsimile machine and the like can be lowered in price.

Furthermore, by only switching the connected state of the second and third wirings D22 and D23 by the switching circuits 401 and 402, it is possible to cause both the first and second pixel sections PXA and PXB to function as a light-emitting section or a light-receiving section, and it is also possible to cause one of them to function as a light-emitting section and the other to function as a light-receiving section.

Furthermore, since a light-shielding bank layer "bank" is formed between the pixel electrode PEA of the first pixel section PXA and the pixel electrode PEB of the second pixel section PXB, even if light is emitted in all directions from the side of the first pixel section PXA which functions as a light-emitting section, it is possible for the bank layer "bank" to prevent the light from leaking to the second pixel section PXB which functions as a light-receiving section. Therefore, it is possible to read an image from a readout object at a high S/N ratio.

[Third Embodiment]

Figure 9A:
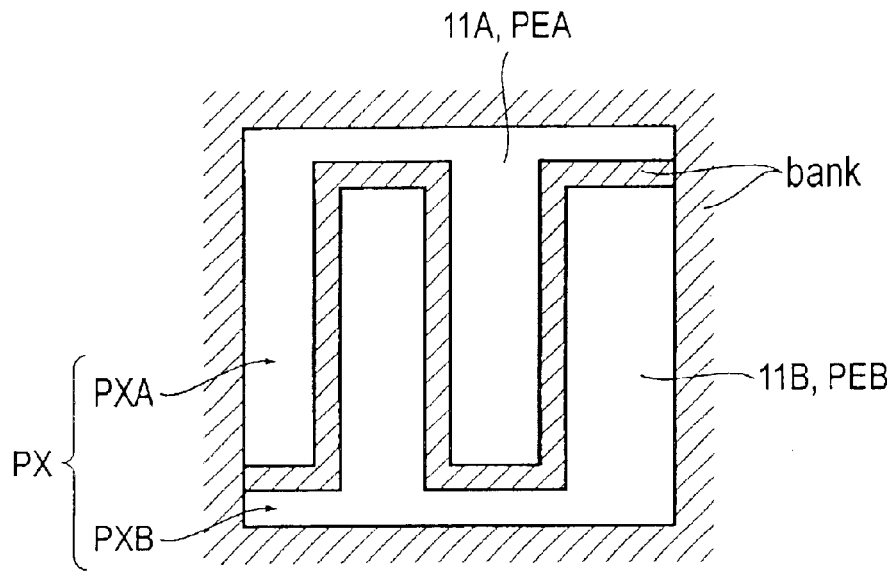
FIGS. 9(A) and 9(B) are each an illustration showing the formation area of two pixel electrodes formed in each pixel of an active matrix in an image sensor apparatus having an additional display device function according to a third embodiment of the present invention.
Figure 9B:
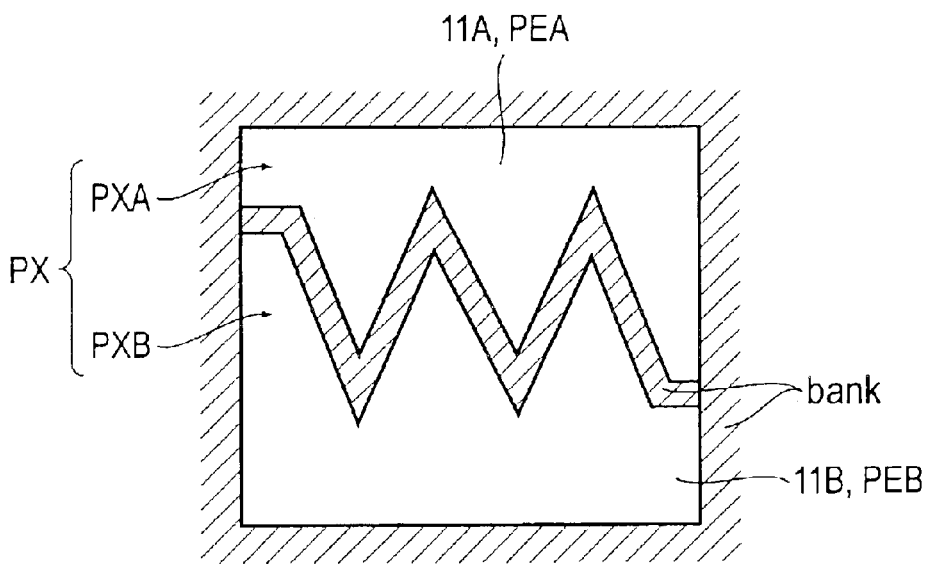

This embodiment is of a construction similar to that of the first embodiment, and differences will be described. In the above-described first and second embodiments, the boundary portion between the formation area of the pixel electrode PEA of the first thin-film optoelectronic transducer 11A and the formation area of the pixel electrode PEB of the second thin-film optoelectronic transducer 11B is in a straight line, whereas, in this embodiment, as shown in FIGS. 9(A) and 9(B), the formation area of the pixel electrode PEA of the first thin-film optoelectronic transducer 11A and the formation area of the pixel electrode PEB of the second thin-film optoelectronic transducer 11B are intermingled with each other. With such a construction, when the image sensor apparatus 1 having an additional display device function is used as an image sensor apparatus, the light which is output from the first pixel section PXA is reflected by a readout object such as a photograph, and efficiently reaches the second pixel section PXB. Even with the construction as described above, formation of a light-shielding layer "bank" between the pixel electrode PEA of the first pixel section PXA and the pixel electrode PEB of the second pixel section PXB makes it possible for the bank layer "bank" to prevent the light from leaking to the second pixel section PXB which functions as a light-receiving section even if light is emitted in all directions from the side of the first pixel section PXA.

[Fourth Embodiment]

Figure 10:
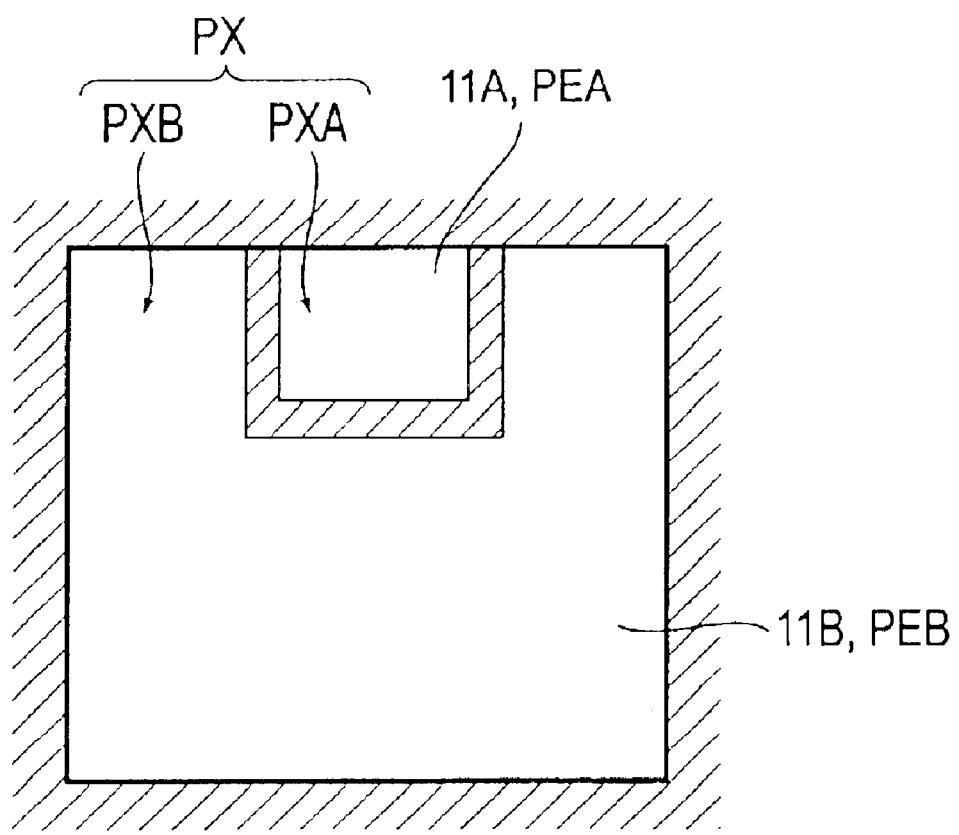
FIG. 10 is an illustration showing the formation area of two pixel electrodes formed in each pixel of an active matrix in an image sensor apparatus having an additional display device function according to a fourth embodiment of the present invention.

This embodiment is also similar to the first embodiment, and differences will be described. In this embodiment, for example, as shown in FIG. 10, if the formation area of the pixel electrode PEA of the first thin-film optoelectronic transducer 11A is surrounded by the formation area of the pixel electrode PEB of the second thin-film optoelectronic transducer 11B, in comparison with a construction in which the outer frames of the gate electrodes are partitioned by a straight line, it is possible for the center-of-gravity position of the formation area of the pixel electrode PEA of the first thin-film optoelectronic transducer 11A to be close to the center-of-gravity position of the formation area of the pixel electrode PEB of the second thin-film optoelectronic transducer 11B, in spite of the fact that the formation area of the pixel electrode PEB is wide.

With this construction, when the image sensor apparatus 1 having an additional display device function is used as an image sensor apparatus, since the center-of-gravity positions (the center positions of light emission and reception) of the pixel electrodes PEA and PEB are close to each other, the light which is output from the first pixel section PXA is reflected by a photograph or the like and efficiently reaches the second pixel section PXB.

Also with this construction, if a light-shielding bank layer "bank" is formed between the pixel electrode PEA of the first pixel section PXA and the pixel electrode PEB of the second pixel section PXB, even if light is emitted in all directions from the side of the pixel section PXA, it is possible for the bank layer "bank" to prevent the light from leaking to the second pixel section PXB that functions as a light-receiving section.

[Fifth Embodiment]

Figure 11A:
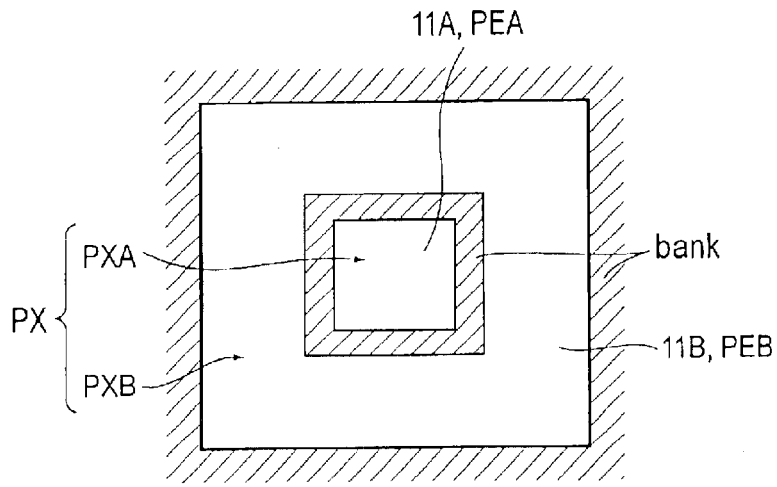
FIG. 11(A) is an illustration showing the formation area of two pixel electrodes formed in each pixel of an active matrix in an image sensor apparatus having an additional display device function according to a fifth embodiment of the present invention.
Figure 11B:
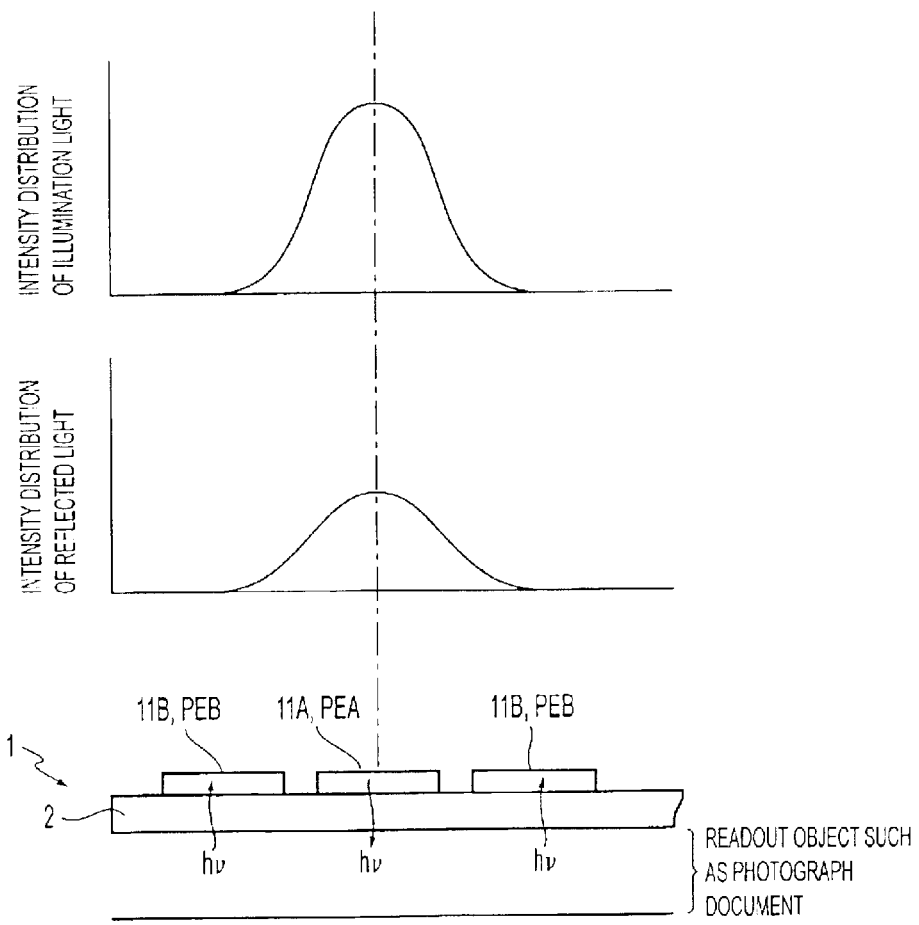
FIG. 11(B) is an illustration showing the operation and the effect when the construction is formed as described above.

This embodiment is also similar to the first embodiment, and differences will be described. In this embodiment, as shown in FIG. 11(A), it is preferable that the formation area of the pixel electrode PEA of the first thin-film optoelectronic transducer 11A be in the central portion of the formation area of the pixel electrode PEB of the second thin-film optoelectronic transducer 11B. With this construction, the center-of-gravity positions of both the formation area of the pixel electrode PEA of the first thin-film optoelectronic transducer 11A and the formation area of the pixel electrode PEB of the second thin-film optoelectronic transducer 11B completely overlap each other. Therefore, as shown in FIG. 11(B), when the light hv which is output from the first pixel section PXA is reflected by a readout object, such as a photograph or a document, and reaches the second pixel section PXB, since the peaks of the intensity distribution of the radiation light to the readout object and the intensity distribution of the reflected light from the readout object are in the central portion of the pixel PX, in the second pixel section PXB, the light is received with high efficiency over the entire surface of the pixel electrode PEB of the second thin-film optoelectronic transducer 11B.

Industrial Applicability

As has been described above, in the image sensor apparatus having an additional display device function of the present invention, since first and second thin-film optoelectronic transducers which function as a light-emitting element and a light-receiving element are formed in each pixel, by only changing the method of driving these thin-film optoelectronic transducers, the image sensor apparatus having an additional display device function can be used as either an image sensor apparatus or a display device. Furthermore, in the image sensor apparatus having an additional display device function of this embodiment, each element can be manufactured by a semiconductor process, and an optical system, a mechanical system, sensors, illumination, and the like, which are expensive, are not required. Therefore, the readout section of a facsimile machine or the like can be lowered in price.

What is claimed is:

1. An image sensing and displaying apparatus comprising:
   a plurality of thin-film photoelectric transducer elements arranged in a matrix, each thin-film photoelectric transducer element emitting light in response to an electrical signal supplied thereto and outputting an electrical signal in response to light input thereto;
   a display circuit which supplies an electrical signal to each of the plurality of thin-film photoelectric transducer elements;
   a sensor circuit which receives an electrical signal from each of the plurality of thin-film photoelectric transducer elements; and
   a switching circuit which switches the display circuit and the sensor circuit on each of the plurality of thin-film photoelectric transducer elements.

2. The image sensing and displaying apparatus according to claim 1, wherein each of the plurality of thin-film photoelectric transducer elements is connected to a first signal line, and the switching circuit connects either one of the display circuit and the sensor circuit to the first signal line.

3. The image sensing and displaying apparatus according to claim 2, wherein each of the plurality of thin-film photoelectric transducer elements comprises a switch element which permits or prevents communications of the electrical signals to the first signal line in accordance with an electrical signal supplied through a second signal line, and wherein the first signal line is commonly connected to some of the plurality of thin-film photoelectric transducer elements.

4. The image sensing and displaying apparatus according to claim 3, wherein the second signal line is commonly connected to some of the plurality of thin-film photoelectric transducer elements disposed in the same row, and the first signal line is commonly connected to some of the plurality of thin-film photoelectric transducer elements disposed in the same column.

5. The image sensing and displaying apparatus according to claim 1, wherein each of the plurality of thin-film photoelectric transducer elements comprises a pair of electrodes and an organic electroluminescent layer disposed between the pair of electrodes, and the electrical signals are one of supplied to and output from the pair of electrodes.

6. An image sensing and displaying apparatus comprising:
   a plurality of pixels arranged in a matrix, each of the pixels including first and second thin-film photoelectric transducer elements which emit light in response to an electrical signal supplied thereto and output an electrical signal in response to light input thereto;
   a display circuit which supplies an electrical signal to the first and second thin-film photoelectric transducer elements;
   a sensor circuit which receives an electrical signal from the first and second thin-film photoelectric transducer elements; and a switching circuit which switches the display circuit and the sensor circuit on each of the first and second thin-film photoelectric transducer elements.

7. The image sensing and displaying apparatus according to claim 6, wherein the first thin-film photoelectric transducer element is connected to a first signal line and the second thin-film photoelectric transducer element is connected to a second signal line, and the first and second signal lines are independently connected to either one of the display circuit and the sensor circuit by the switching circuit.

8. The image sensing and displaying apparatus according to claim 7, wherein each of the first and second thin-film photoelectric transducer elements comprises a switch element which permits or prevents communications of the electrical signals to the first and second signal lines in accordance with an electrical signal supplied through a third signal line, and wherein the first and second signal lines are commonly provided to some of the plurality of pixels disposed in the same row and the third signal line is commonly provided to some of the plurality of pixels disposed in the same column.

9. The image sensing and displaying apparatus according to claim 6, wherein each of the first and second thin-film photoelectric transducer elements comprises a pair of electrodes and an organic electroluminescent layer disposed between the pair of electrodes, and the electrical signals are one of supplied to and output from the pair of electrodes.

10. An image sensing and displaying apparatus comprising:
a plurality of pixels arranged in a matrix, each of the pixels including a first thin-film photoelectric transducer element which emits light in response to an electrical signal supplied thereto and a second thin-film photoelectric transducer element which outputs an electrical signal in response to light input thereto;
a display circuit which supplies an electrical signal to the first thin-film photoelectric transducer element; and
a sensor circuit which receives an electrical signal from the second thin-film photoelectric transducer element.

11. The image sensing and displaying apparatus according to claim 10, wherein the first thin-film photoelectric transducer element is connected to the display circuit via a first signal line and the second thin-film photoelectric transducer element is connected to the sensor circuit via a second signal line.

12. The image sensing and displaying apparatus according to claim 11, wherein each of the first and second thin-film photoelectric transducer elements comprises a switch element which permits or prevents communications of the electrical signals to the first and second signal lines in accordance with an electrical signal supplied through a third signal line, and wherein the first and second signal lines are commonly provided to some of the plurality of pixels disposed in the same row and the third signal line is commonly provided to some of the plurality of pixels disposed in the same column.

13. The image sensing and displaying apparatus according to claim 10, wherein each of the first and second thin-film photoelectric transducer elements comprises a pair of electrodes and an organic electroluminescent layer disposed between the pair of electrodes, and wherein the electrical signals are one of supplied to and output from the pair of electrodes.

* * * * *